US006643668B2

(12) United States Patent
Sluiman

(10) Patent No.: US 6,643,668 B2
(45) Date of Patent: Nov. 4, 2003

(54) METHOD AND DEVICE FOR SEMANTIC RECONCILING OF COMPLEX DATA MODELS

(75) Inventor: Harm Sluiman, Scarborough (CA)

(73) Assignee: International Business Machines Corporation, Armonk, NY (US)

( * ) Notice: Subject to any disclaimer, the term of this patent is extended or adjusted under 35 U.S.C. 154(b) by 318 days.

(21) Appl. No.: 09/840,852

(22) Filed: Apr. 24, 2001

(65) Prior Publication Data

US 2002/0194220 A1 Dec. 19, 2002

(30) Foreign Application Priority Data

Apr. 3, 2001 (CA) .............................................. 2343494

(51) Int. Cl.[7] .............................................. G06F 17/00
(52) U.S. Cl. ........................ 707/200; 707/102; 709/246; 717/104
(58) Field of Search .................... 707/1–10, 100–104.1, 707/200–206; 709/220–249; 717/100–113

(56) References Cited

U.S. PATENT DOCUMENTS

| | | | | |
|---|---|---|---|---|
| 6,012,098 | A | 1/2000 | Bayeh et al. ................ | 709/246 |
| 6,125,391 | A | 9/2000 | Meltzer et al. .............. | 709/223 |
| 6,519,601 | B1 * | 2/2003 | Bosch ......................... | 707/100 |
| 6,556,950 | B1 * | 4/2003 | Schwenke et al. ........... | 707/103 |
| 6,567,796 | B1 * | 5/2003 | Yost et al. ...................... | 707/2 |

OTHER PUBLICATIONS

Shen et al., Commit–Reconcile and Fences (CRF): a new memory model for architects and compiler writers, Computer Architecture, 1999, Proceedings of the 26th International Symposium on, 1999, pp. 150–161.*

Bianco et al., A Markov random field approach for querying and reconciling heterogeneous databases, Database and Expert Systems Applications, 1999, Proceedings, Tenth International Workshop on, 1999, pp. 185–191.*

Stephens et al., Consens ontologies. Reconciling the semantics of Web pages and agents, Internet Computing, IEEE, vol. 5, Issue 5, Sep./Oct. 2001, pp. 92–95.*

"XML–Based Templates for Generating Artifacts from Java–Based Models," *Research Disclosure*, Dec. 1998, p. 1678.

Brasethvik and Gulla, "Semantically Accessing Documents Using Conceptual Model Descriptions," Dept. of Computer and Information Science, Norwegian University of Technology and Science.

* cited by examiner

*Primary Examiner*—David Jung
(74) *Attorney, Agent, or Firm*—Sawyer Law Group LLP

(57) ABSTRACT

A method and device for semantically reconciling complex data models is disclosed. A first transform is initially applied to received divergent complex data models in order to extract fundamental data representing selected divergent aspects of the complex data models that are to be reconciled. The extracted fundamental data are then semantically displayed in a manner suitable for both identifying differences between the aspects to be reconciled and for reconciling them. Input representative of a reconciliation of the fundamental data by a reconciling individual is received, and the fundamental data are reconciled accordingly to generate a single reconciled fundamental data set. The reconciled fundamental data set is then expanded into a corresponding reconciled complex data model by application of a second transform. The transforms are optionally capable of providing automatic enforcement of complex data model data abstractions and value dependencies during reconciliation.

48 Claims, 10 Drawing Sheets

Complex Data Model A (XML data instance v.1):

```
<?xml version="1.0" encoding="OTF-8"?>    ←A            C
<Package id="1" name="myPackage">                       ↓
    <file id="2" name="myClass.java">  ←B
        <class id="3" name="myClass" owner=otherXMLdocument.xml#JoeSmith"
            <visible="1">   ←—— D
            <member id="4" name="COPYRIGHT" type="idrefToStringType"
                                    initialValue="Copyright 2001"/>
        </class>
    </file>
</package>
```

FIG. 5A

Complex Data Model B (XML data instance v.2):

```
<Package id="1" name="myPackage">          A              C
    <file id="2" name="myClass2.java">  ←                 ↓
        <class id="3" name="myClass2" owner=otherXMLdocument.xml#JohnFish"
            <visible="0">  ←— D      ↖B
            <member id="4" name="COPYRIGHT" type="idrefToStringType"
                                    initialValue="Copyright 2001"/>
        </class>
    </file>
</package>
```

FIG. 5B

Transform F1 (pseudocode):

```
[Given the complex data model stream]
Read the complex data model stream;
For each package DO
    For each file DO
        For each class DO
            write out a class element having two attributes comprising the
                current class' id and name;
            write out a sub element of the class for the package having a
                single attribute comprising the current package id;
            write out a sub element of the class for the file having a
                single attribute comprising the current file id;
        For each member DO
            write out a sub element of the class for the current member
                wherein the element name is the member name concatenated
                with the word "member" and having an attribute comprising
                the current member id;
        End member DO
            write out a sub element of the class for the visible property
                of the class replacing any numeric value with its language
                string equivalent;
            write out a sub element of the class for the owner property
                of the class using the name that is retrieved by navigating
                the idref in the owner property;
            write out a class element end tag to close the class element;
        END class DO
    END file DO
END package DO
```

FIG. 6A

Transform F2 (pseudocode):

```
[Given the base line complex data model (CDM) stream and the reconciled
fundamental data set (FDS) stream]
Read the FDS stream;
FOR each class DO
   locate the package element in the FDS stream;
   use the package element's id value to locate the package element in
      one of the base line streams;
   write out the correct base line package element to the reconciled CDM;
   locate the file element in the FDS stream;
   use the file element's id value to locate the file element in
      one of the base line streams;
   write out the correct base line file element to the reconciled CDM;
   locate the class element in the FDS stream;
   use the class element's id value to locate the class element in one
      of the base line streams;
   locate the visibility element in the FDS stream;
   use the visibility element's value to determine the value to write
      to the class element;
   locate the author element in the FDS stream;
   use the author element's value to query a name database and
      construct an idref to update the owner property of the class
      element;
   write out the class element to the reconciled CDM;
   FOR all other sub elements of class DO
         use the id value to locate the appropriate member element
         in one of the base line streams;
         write out the located base line member element to the
            reconciled CDM;
   END sub element DO
   write out end tag to close class element in reconciled CDM;
   write out end tag to close file element in reconciled CDM;
   write out end tag to close package element in reconciled CDM;
END class DO
```

FIG. 6B

Fundamental Data Set A':

```
<class id="3" name="myClass">   ◄——— I
    <package id="1"/>
    <file id="2"/>
    <copyrightmember id="4"/>
    <visibility="private"/>   ◄——— II
    <author="Joe Smith"/>   ◄——— III
</class>
```

FIG. 7A

Fundamental Data Set B':

```
<class id="3" name="myClass2">   ◄——— I
    <package id="1"/>
    <file id="2"/>
    <copyrightmember id="4"/>
    <visibility="public"/>   ◄——— II
    <author="John Fish"/>   ◄——— III
</class>
```

FIG. 7B

Visualization Paradigm:

```
<visualizationParadigm>
    <Member name="Class" gif="class.gif"/>
    <Member name="visibility">This is the hint text
            explaining public versus private. </Member>
    <Member name="author" gif="person.gif"/>
</visualizationParadigm>
```

FIG. 8

Semantically displayed fundamental data sets A' and B' (prior to reconciliation):

Semantically displayed fundamental data set C'
(resulting from reconciliation of fundamental data sets A' and B'):

Reconciled Fundamental Data Set C':

```
<class id="3" name="myClass2">
    <package id="1"/>
    <file id="2"/>
    <copyrightmember id="4"/>
    <visibility="private"/>
    <author="Joe Smith"/>
</class>
```

FIG. 11

Reconciled Complex Data Model C (XML data instance v.3):

```
<Package id="1" name="myPackage">
    <file id="2" name="myClass2.java">
        <class id="3" name="myClass2" owner=otherXMLdocument.xml#JoeSmith"
            <visible="private">
            <member id="4" name="COPYRIGHT" type="idrefToStringType"
                                initialValue="Copyright 2001"/>
        </class>
    </file>
</package>
```

FIG. 12

METHOD AND DEVICE FOR SEMANTIC RECONCILING OF COMPLEX DATA MODELS

FIELD OF THE INVENTION

The present invention relates to complex data models, and more particularly to a method and device for semantic reconciling of complex data models.

BACKGROUND OF THE INVENTION

In recent years, use of platform-independent and application-independent metadata has become more prevalent in digital computing. As known by those skilled in the art, metadata is a definition or description of data. Metadata provides a structure, or schema, for generating or validating data instances. Unlike traditional data specifications, metadata is expressed through the use of metalanguages such as the Standard Generalized Markup Language (SGML) or the Extensible Markup Language (XML), which permit a user to define lexical tags to describe a structure for data. Corresponding data instances may then employ these user-defined tags to describe content. Advantageously, a metadata schema transmitted with such data instances may be used with a generic compiler to validate or interpret the data instances. Accordingly, metadata can support effective sharing of data. As well, because metalanguages are ASCII-based, platform dependencies are minimized or eliminated.

Metadata schema and data instances are referred to as complex data models. Many complex data models suffer from a common problem, namely, the possibility of divergence or lack of coherence between versions. As data models are updated over time, copies of legacy models may remain for various reasons. The existence of multiple model versions may be attributable to a lack of version control, for example, or to confusion over which version is the most current. Alternatively, two or more developers may intentionally make distinct sets of changes to a data model in order to promote parallel development efficiencies.

Regardless of the cause of the divergence, in these situations one is faced with the task of reconciling two or more versions of a complex data model. Traditionally, reconciliation of divergent complex data models has involved a manipulation of the divergent versions in their source metalanguage form, i.e. in the complex data model domain, to effect a manual reconciliation of the differences. Thus, a reconciling individual (or "reconciler") might use a standard text editor to edit divergent complex data model data files simultaneously. More specifically, the reconciler may perform a textual comparison of the versions and then manually merge them into a reconciled version of the model by cutting and pasting metalanguage fragments (i.e. entities or attributes) for example. Disadvantageously however, this process can be difficult, for a number of reasons.

First, because a reconciliation of this type is performed in the complex data model domain, in order to be able to effectively reconcile the versions, a reconciler must not only have a good understanding of the semantic domain, s/he must also be familiar with the low-level lexical and syntactic details of the associated complex data model. As a simple example, in the case where a person is responsible for reconciling two versions of a complex data model representing an instance of an integrated circuit design, the person would not only be required to be familiar with the microelectronic engineering principles governing the reconciliation (i.e. the semantic domain), but would also have to be familiar with the particular integrated circuit schema and lexical tags being used to express its design (i.e. the complex model domain). This requirement for expertise in both the semantic and complex data model domains complicates the training necessary for an individual to become a qualified reconciler and correspondingly reduces the number of persons whose skill set is sufficiently broad to perform model reconciliation. Moreover, errors may be introduced during reconciliation in the event that a reconciler's knowledge of the complex data model is imperfect.

Second, because each complex data model version to be reconciled typically constitutes a complete copy of the model, the person responsible for reconciliation may be required to parse through virtually the entire model to make the requisite changes, even though much of the model may be irrelevant with respect to the particular reconciliation at hand. This can be a time consuming and tedious process, especially when the model is sizeable.

Third, because manual reconciliation of this type does not provide for the automatic enforcement of data abstractions or value dependencies which may exist in the complex data models to be reconciled, reconciliation may result in the introduction of errors into the complex data model. This is especially true in the case where the reconciler is unfamiliar with the model's data abstractions or value dependencies.

Fourth, manual reconciliation tools are not easily customized to a particular reconciliation task. Some reconciliation tasks warrant reconciliation of divergent complex data models only with respect to a subset of their divergent aspects for which reconciliation has been deemed important. A manual reconciliation tool provides no mechanism for identifying a divergent aspect within a complex data model as being "important" (requiring reconciliation) or "unimportant" (not requiring reconciliation).

A number of alternative approaches and reconciliation tools have been developed. One type of tool, which is a variation of the traditional approach, operates by displaying the textual metalanguage of the versions to be reconciled side-by-side along with visual cues (such as colored text for example) accentuating the differences to be resolved. The visual cues tend to focus the reconciling individual on the reconciliation task at hand and may thereby expedite the reconciliation process. As well, this approach may involve some automatic syntax-checking of the complex data model to ensure that syntax errors are not introduced during reconciliation.

The described type of tool does not, of course, alleviate all of the above-noted reconciliation difficulties. Fundamentally, the reconciling individual is still required to work in the complex data model domain, complete with its intricate lexicon and syntax rules. Thus, it is still necessary to employ a reconciler who has a good understanding of both the complex data model and the associated semantic domains. Moreover, because such tools typically present the complex data model versions to the reconciler in their entirety rather than just the aspects to be reconciled, the reconciler may still be required to scan through much information that is superfluous to his/her specific reconciliation duty. This can be time consuming as well as prone to error. Additionally, because such tools typically do not support the automatic enforcement of any data abstractions or value dependencies existing in the complex data models, erroneous implementation may occur. This is especially true when data abstractions or value dependencies with which the reconciler is unfamiliar are present in the model. Finally, reconciliation efficiency may suffer due to the fact that such tools are not easily customized to a particular reconciliation task and because no mechanism is provided to distinguish divergent aspects requiring reconciliation from divergent aspects not requiring reconciliation.

Another known type of tool takes a more customized approach towards the reconciliation of complex data model versions. In this approach, the reconciliation tool is tailored exclusively to the complex data model and reconciliation task in question. The tool is capable of interpreting the lexicon, syntax, data abstractions and value dependencies of the complex data models to be reconciled and is programmed with sufficient information regarding the reconciliation task at hand to be capable of merging divergent aspects of the versions with little or no instruction from the reconciling individual. Such a tool typically has a custom user interface that is specific to the complex data model and reconciliation task being performed. Advantageously, divergent complex data models aspects are displayed semantically, allowing reconciliation to be performed in the semantic domain. Accordingly, the requirement for human parsing of a complex data model is reduced or eliminated. As well, because tools of this type are customized, they are capable of reconciling only certain "important" divergent aspects.

This second type of reconciliation tool is problematic, however, in one key aspect. Fundamentally, because the tool is customized exclusively to a particular type of complex data model to be reconciled as well as a particular reconciliation task to be performed, it has virtually no flexibility of application. In order to be used for a different type of complex data model or reconciliation task, a new tool must be designed, implemented and tested. This is a time-consuming, tedious and expensive process.

Hence what is needed is a method and device for semantic differencing and merging of complex data models which addresses at least some of the above named difficulties.

SUMMARY OF THE INVENTION

A method and device for semantically reconciling complex data models is disclosed. A first transform is initially applied to received divergent complex data models in order to extract fundamental data representing selected divergent aspects of the complex data models that are to be reconciled. The extracted fundamental data are then semantically displayed in a manner suitable for both identifying differences between the aspects to be reconciled and for reconciling them. Input representative of a reconciliation of the fundamental data by a reconciling individual is received, and the fundamental data are reconciled accordingly to generate a single reconciled fundamental data set. The reconciled fundamental data set is then expanded into a corresponding reconciled complex data model by application of a second transform. The transforms are optionally capable of providing automatic enforcement of complex data model data abstractions and value dependencies during reconciliation.

BRIEF DESCRIPTION OF THE DRAWINGS

In the figures which illustrate an example embodiment of this invention:

FIGS. 5A and 5B illustrate exemplary complex data models capable of reconciliation by the system of FIG. 1;

FIG. 6A illustrates, in pseudocode form, an exemplary transform F1 capable of configuring the fundamental data extractor of FIG. 1 to extract fundamental data from received complex data models;

FIG. 6B illustrates, in pseudocode form, an exemplary transform F2 capable of configuring the fundamental data expander of FIG. 1 to expand a reconciled fundamental data set into its corresponding full complex data model;

FIGS. 7A and 7B illustrate fundamental data sets A' and B' created by an application of the transform F1 to the complex data models A and B of FIGS. 5A and 5B, respectively;

FIG. 8 illustrates a visualization paradigm for configuring the semantic display of fundamental data by the system of FIG. 1;

FIG. 11 illustrates the reconciled fundamental data set C' that is created by the system of FIG. 1 following reconciliation; and FIG. 12 illustrates a complex data model C representative of a reconciliation of complex data models A and B which is created by an application of the transform F2 to the reconciled fundamental data set C'.

DETAILED DESCRIPTION

Figure 1:
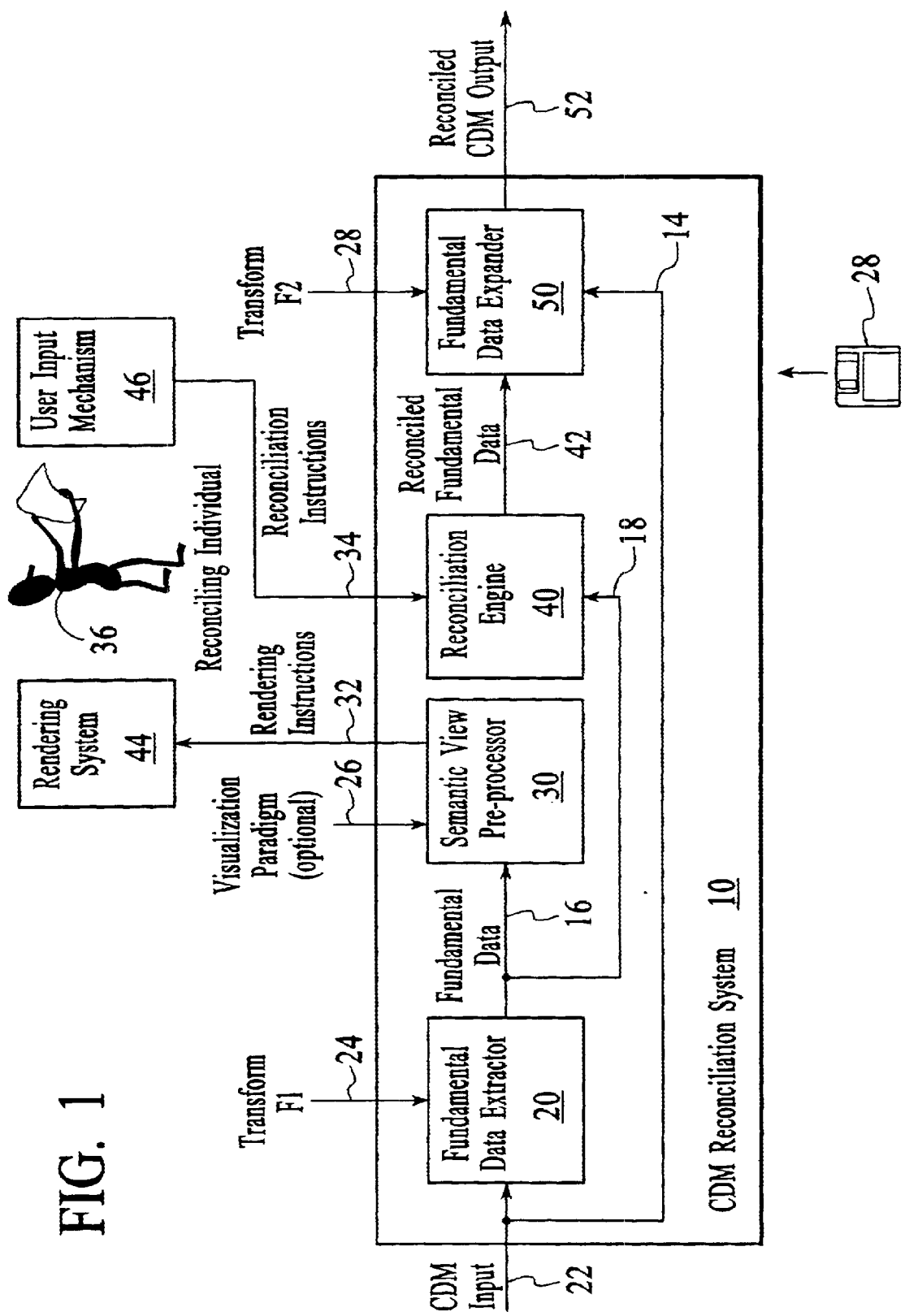
FIG. 1 is a schematic diagram illustrating a complex data model reconciliation system exemplary of an embodiment of the present invention.

With reference to FIG. 1, a complex data model (CDM) reconciliation system 10 includes a fundamental data extractor 20, a semantic view pre-processor 30, a reconciliation engine 40, and a fundamental data expander 50. The system 10 has a single primary input 22 for complex data models to be reconciled, and a single primary output 52 for reconciled CDM output. Input 22 inputs the fundamental data extractor 20 as well as the fundamental data expander 50. The expander 50 outputs output 52. The system 10 also has two secondary inputs, namely, a first transform input 24 which inputs to the fundamental data extractor 20 and a second transform input 26 which inputs to the fundamental data expander 50. An optional third secondary input 26 inputs visualization paradigm information to the semantic view pre-processor 30. System 10 further has an intermediate output 32 from the semantic view pre-processor 30 and an intermediate input 34 to the reconciliation engine 40. As will be understood, intermediate output 32 carries information for display on rendering system 44 to a reconciling individual 36 and input 34 carries user input from reconciling individual 36 by way of user input mechanism 46.

The fundamental data extractor 20 of system 10 is interconnected with the semantic view pre-processor 30 by a link 16 which carries fundamental data representing aspects of received complex data models that have been extracted from received CDMs by fundamental data extractor 20. The extracted fundamental data is also provided to the reconciliation engine 40 by way of link 18. The reconciliation engine 40 is additionally interconnected with the fundamental data expander 50 by link 42 which carries a reconciled fundamental data set representative of a reconciliation of the fundamental data sets extracted by fundamental data extractor 20.

The system 10 is typically a conventional computing device or server executing software 28 that has been tailored to implement a CDM reconciliation system as described herein. The software 28 may be loaded into the memory of the system 10 from any suitable computer readable medium, such as a magnetic disk, optical storage disk, memory chip, or file downloaded from a remote source. In an alternative embodiment, the system 10 may be implemented as a distributed system comprising multiple computing devices or servers interconnected by a network, wherein the modules 20, 30, 40 and 50 are executed on different devices/servers, and wherein inter-module data communication is achieved by way of a network communications protocol for example. In another alternative, the modules may be grouped within specific devices or servers in a distributed system. For example, modules 20 and 30 may be executed on one device/server while modules 40 and 50 may be executed on a different device/server. Those skilled in the art will recognize that numerous alternative system architectures are possible.

Fundamental data extractor 20 is a module capable of extracting fundamental data from received complex data models to be reconciled. The extractor 20 has two inputs, namely an input 22 for receiving complex data models and an input 24 for receiving a first transform F1. Fundamental data extractor 20 is capable of receiving multiple complex data models, however the number of models typically received is two, representing a pair of divergent CDMs to be reconciled with one another. The fundamental data extractor 20 applies the transform F1 to each received complex data model in order to obtain corresponding sets of extracted fundamental data. The number of sets of fundamental data generated by the fundamental data extractor 20 is equivalent to the number of received CDMs, and again is typically two. The generated sets of fundamental data include aspects of the received models that are to be differenced and merged during the immediate reconciliation, which may comprise some or all the divergent aspects of the received CDMs. The generated fundamental data sets may also include aspects of the received models that are not divergent but rather provide information that facilitates semantic differencing and merging by a reconciler during reconciliation.

A complex data model may be a metadata schema or data instance. Complex data models are typically in the form of electronic data files employing metalanguage such as the Standard Generalized Markup Language (SGML) or the Extensible Markup Language (XML). In the case where a complex data model is a schema, the CDM may be a Document Type Definition (DTD) or an XML Metadata Interchange (XML) document for example.

The first transform F1 is a set of instructions that controls which divergent aspects of the CDMs (and, optionally, non-divergent aspects which may provide useful information to a reconciler) are to be extracted from the received CDMs by the extractor 20. Transform F1 is typically in the form of an electronic file readable by a conventional computing device. The form or syntax of the instructions contained in first transform F1 is dependent on the metalanguage of the received CDMs as well as the chosen implementation of the fundamental data extractor 20. For example, in the case where the received CDMs are in the XML metalanguage and the fundamental data extractor 20 is capable of interpreting Extensible Stylesheet Language (XSL) Transforms (XSLTs) (which, as is known in the art, provide instructions on transforming XML models), the transform F1 may be an XSLT. However, if the extractor 20 is incapable of interpreting XSLTs, the transform may be in some alternative form, such as an Awk or PERL program, that is usable by the extractor 20 to achieve the same data extraction purpose. In another alternative, the form of the transform may be entirely proprietary. The precise form or syntax of the instructions comprising first transform F1 is unimportant provided that they are capable of being interpreted by the fundamental data extractor 20 in order to effect the extraction of fundamental data pursuant to the desired reconciliation objectives. The first transform F1 may be capable of configuring the fundamental data extractor 20 to automatically recognize and enforce data abstractions or value dependencies existing in the complex data models during data extraction, as will be described.

Generated fundamental data sets each typically consist of a file employing metalanguage that is based on information extracted from the corresponding complex data model.

Semantic view pre-processor 30 is a module capable of generating instructions usable by a rendering system 44 to semantically display fundamental data extracted by the fundamental data extractor 20 in a manner suitable for both identifying differences between divergent CDM aspects and for reconciling them. The semantic view pre-processor 30 is capable of displaying non-divergent fundamental data as may be necessary to support reconciliation. The semantic view pre-processor 30 has an input for receiving fundamental data sets from link 16 and an output 32 for outputting rendering system instructions and data to rendering system 44. The semantic view pre-processor 30 effectively performs a domain shift of the received fundamental data sets from the complex data model domain (typically involving various lexical, syntactic and other rules) to the semantic domain that is more easily understood by a reconciling individual 36. The generated semantic domain representation is usually graphically based; however, provided that the representation is comprehensible to a reconciler familiar with the relevant semantic domain, graphical representation is not necessary. The outputted rendering instructions include commands readable by the rendering system 44 to create various user interface constructs, such as text boxes, menu options or buttons for example, which support semantic differencing and merging of the displayed fundamental data sets by a reconciling individual 36.

Optional input 26 to the semantic view pre-processor 30 inputs an optional visualization paradigm to the semantic view pre-processor 30. The optional visualization paradigm is a set of instructions, typically in the form of an electronic file, capable of being interpreted by the semantic view pre-processor 30 to bestow a particular "look and feel" to the information that is represented graphically in the semantic domain. Preferably, the bestowed look and feel is one that follows commonly accepted conventions in the relevant semantic domain, so as to promote comprehensibility by the reconciling individual 36. The optional visualization paradigm is usually, but not necessarily, developed by the designer of transform F1.

Rendering system 44 is a system capable of interpreting received rendering instructions to generate a semantic representation of the fundamental data to be reconciled. Rendering system 44 may be a Visual Basic application, world wide web browser, or standard graphics engine for example, executing on a conventional computing device, which may be the same computing device as that which comprises the CDM reconciliation system 10. The system 44 incorporates a display, such as a conventional computer monitor, to display rendered data to a reconciling individual 36.

The user input mechanism 46 is a device operable by a reconciling individual 36 to input reconciliation instructions to the system 10. The user input mechanism 46 may be, for example, a keyboard, mouse or touch screen usable in conjunction with the rendering system 44 to interact with the semantically displayed data and user interface constructs for the purpose of effecting a desired reconciliation.

The reconciliation engine 40 is a module capable of reconciling received fundamental data sets based on instructions received from the user input mechanism 46 operated by the reconciling individual 36. The reconciliation engine 40 has two inputs, one for receiving fundamental data to be reconciled from link 18 and a second input 34 for receiving reconciliation instructions from the user input mechanism 46. The reconciliation engine 40 also has a single output for outputting a single reconciled fundamental data set to link 42. The reconciliation engine 40 receives instructions from the user input mechanism 46 representing reconciliation choices made by the reconciler and interprets these instructions to generate a reconciled fundamental data set accordingly. In particular, for each displayed divergent aspect of the CDMs to be reconciled, the reconciliation engine 40 will identify one version of the divergent aspect as the desired or correct version based on the input from the reconciling individual 36 and represent that version in the reconciled fundamental data set. In so doing, the engine 40 effectively performs a domain shift of the reconciling individual's instructions from the semantic domain to the complex data model domain. The totality of the correct versions of each divergent element are thus compiled into a resultant reconciled fundamental data set which is output over link 42.

Fundamental data expander 50 is a module capable of expanding a reconciled fundamental data set into its full complex data model equivalent. Fundamental data expander 50 has three inputs. The first input is for receiving a single reconciled set of fundamental data from the reconciliation engine 40 over link 42. The second input is for receiving the original CDMs to be reconciled over link 14. The third input 26 is for receiving a second transform F2. The fundamental data expander 50 applies the transform F2 to the received fundamental data set in order to expand it into its full CDM equivalent representative of a reconciliation of the originally received CDMs. During this process, the originally received CDMs may be referenced to obtain information about the CDMs that is necessary for expansion but is unavailable from the other inputs. For example, the original CDMs may provide information regarding non-divergent aspects not represented in the reconciled fundamental data set. The fundamental data expander 50 has a single output 52, which also outputs the CDM reconciliation system 10, for outputting the reconciled complex data model.

The second transform F2 is a set of instructions which controls the process of expanding a reconciled fundamental data set into a corresponding complex data model. Second transform F2 thus essentially serves a complementary purpose to that served by first transform F1. Like transform F1, transform F2 is typically an electronic file readable by a conventional computing device. The form or syntax of the instructions contained the second transform F2 is usually the same as the form or syntax used in transform F1, and is dependent on the metalanguage comprising the received CDMs as well as the chosen implementation of the fundamental data expander 50. The second transform F2 is usually, but not necessarily, designed by the same individual who designed the first transform F1. Depending upon its implementation, the second transform F2 may be capable of configuring the fundamental data expander 50 to automatically recognize and enforce data abstractions or value dependencies existing in the complex data models during the expansion process, as will be described.

The CDM reconciliation system 10 further includes a user interface (not illustrated) capable of being employed by a reconciling individual 36 to control the execution of various steps in the reconciliation process. The user interface may include various controls, such as menus, buttons or entered commands, for this purpose. The user interface is typically usable in conjunction with the user input mechanism 46 and the rendering system 44 to provide an integrated control and display console usable by the reconciling individual 36 for convenient reconciliation of CDMs.

An important feature of the present embodiment of the CDM reconciliation system 10 is its capability of configuration by a user to a wide variety of complex data model types and reconciliation tasks. Ease of configuration is primarily due to two factors. First, the behavior of the system during reconciliation is governed by transforms F1 and F2, which control the type and degree of both the extraction of fundamental data from received CDMs, and the corresponding creation of a CDM from the reconciled set of fundamental data. Thus, when configured with one pair of transforms F1 and F2, the system 10 may be capable of reconciling all divergent aspects of SGML schemas comprising DTDs for an integrated circuit design for example. When configured with a different pair of transforms F1 and F2, the system 10 may alternatively be customized for reconciling the same SGML schemas in only certain divergent aspects. When configured with a third pair of transforms F1 and F2, the system 10 may instead become capable of reconciling XML data instances which describe versions of a Java class. Second, because transforms F1 and F2 are typically electronic files within the system 10, they may be easily replaced, through a file copy or file overwrite operation for example. As a result, the system 10 may easily, quickly and cheaply be configured and reconfigured to reconcile a wide range of native complex data model types, encompassing various metalanguages and metadata types. Moreover, there is no need to design, develop and implement a full reconciliation system for each different type of reconciliation task.

Another important feature of the present embodiment is its capacity to perform reconciliation in the semantic domain as opposed to the complex data model domain. This capability is best illustrated through a description of the data transformations that occur during CDM reconciliation.

Figure 2:
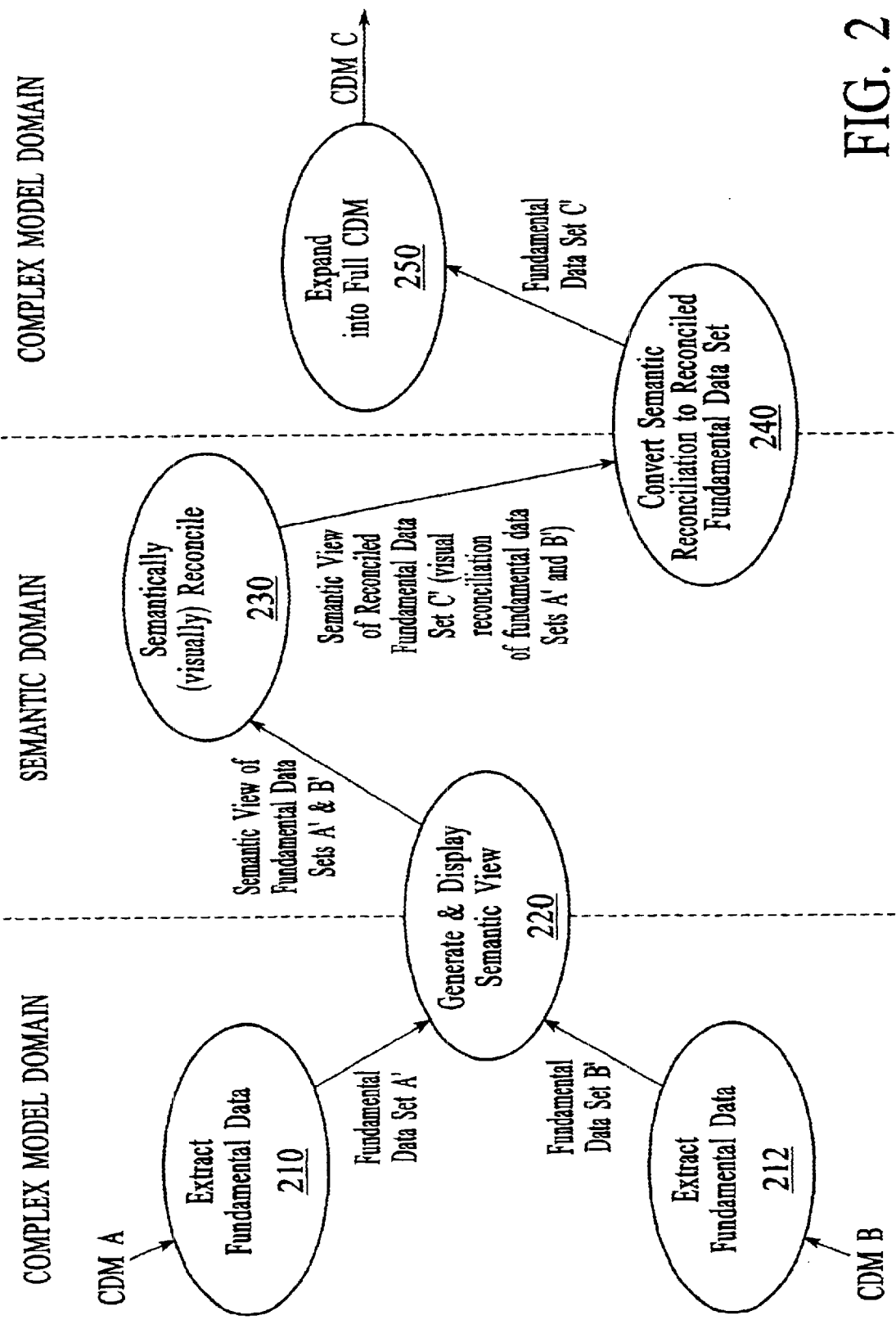
FIG. 2 is a data flow diagram illustrating data flow during complex data model reconciliation according to the present invention.

FIG. 2 is a data flow diagram highlighting the transformations which complex data models undergo during reconciliation by the CDM reconciliation system 10. The data flow diagram illustrates a reconciliation by system 10 of two complex data models A and B into a single complex data model C. For clarity, the flow of data types other than CDMs and fundamental data is not illustrated. Arrows in FIG. 2 represent data flow while bubbles represent operations on data. It is assumed that the system 10 has been previously configured with transforms F1 and F2 to be capable of reconciling the complex data models A and B referenced in FIG. 2. It is further assumed that the CDMs A and B to be reconciled have initially been received by the system 10. The received complex data models are metadata schema or data instances and are therefore in the complex data model domain.

OLD: In operations 210 and 212, fundamental data extraction is performed on the received CDMs A and B. Operations 210 and 212 occur in the fundamental data extractor module 20 (FIG. 1). The result of the data extraction operations 210 and 212 is the generation of fundamental data sets A' and B', which represent aspects of received complex data models A and B (respectively) that have been extracted for reconciliation. It is understood that fundamental data sets A' and B' may represent all the divergent aspects of complex data models A and B or a subset thereof. The generated fundamental data sets A' and B' are metalanguage files and are accordingly also in the complex data model domain. It will be appreciated that the extraction performed in each of operations 210 and 212 is governed by the first transform F1.

In operations 210 and 212, fundamental data extraction is performed on the received CDMs A and B. Operations 210 and 212 occur in the fundamental data extractor module 20 (FIG. 1). The result of the data extraction operations 210 and 212 is the generation of fundamental data sets A' and B', which represent aspects of received complex data models A and B (respectively) that have been extracted for reconciliation. It is understood that, depending upon the implementation of the first transform F1 (which governs the extraction performed in each of operations 210 and 212), fundamental data sets A' and B' may represent all the aspects of complex data models A and B that are anticipated to be divergent, or a subset thereof. The generated fundamental data sets A' and B' are metalanguage files and are accordingly also in the complex data model domain.

In a subsequent operation 220, a semantic view of fundamental data A' and B' is generated and displayed. In particular, the operation 220 converts the received fundamental data sets A' and B' from metalanguage files into a visual semantic representation of the fundamental data sets A' and B' that is displayed to a reconciling individual 36. The displayed visual representation is suitable for allowing a reconciling individual to both identify differences between the extracted aspects to be reconciled and to reconcile them. The generated semantic domain representation is usually, but not necessarily, graphically based, and should be comprehensible to a reconciler familiar with the relevant semantic domain. Operation 220 occurs in the semantic view pre-processor module 30 as well as in the rendering system 44 (FIG. 1). The visualization operation 220 may involve the application of an optional visualization paradigm for improved semantic comprehensibility. It will be appreciated that the semantic view generation operation 220 represents a transformation of the fundamental data sets A' and B' from the complex model domain to the semantic domain.

Next, in operation 230 the displayed fundamental data sets A' and B' are reconciled by the reconciling individual 36 to form a visual reconciliation of the fundamental data sets. The reconciler achieves this by viewing the semantically displayed divergent complex data model aspects via the rendering system 44 and reconciling them through interaction with the user input mechanism 46 (FIG. 1). The reconciliation essentially comprises a selection, for each displayed divergent aspect, of a preferred version of that aspect as between the displayed divergent versions. Operation 230 occurs within the semantic domain.

In the subsequent operation 240, the visual representation of the reconciled fundamental data sets A' and B' is converted to a corresponding metalanguage file comprising fundamental data set C'. The reconciled fundamental data set C' generated by operation 240 constitutes a metalanguage compilation of the favored versions of each divergent aspect of fundamental data sets A' and B' as selected by the reconciling individual. The conversion operation 240 is initiated upon the completion of reconciliation by the reconciling individual. Operation 240 is performed in the reconciliation engine 40 (FIG. 1) and represents a transformation of the reconciliation from the semantic domain to the complex data model domain.

Finally, the metalanguage of reconciled fundamental data set C' is expanded into its full complex data model equivalent in fundamental data expansion operation 250. This operation occurs in fundamental data expander 50 (FIG. 1) which is governed by the second transform F2. The single output is a complex data model C representing a reconciliation of complex data models A and B. The output model C may constitute a complete reconciliation of all of the divergent aspects of complex data models A and B or a subset thereof, depending on the nature of the performed extraction operations 210 and 212 complementary expansion operation 250. The expansion operation 250 occurs within the complex data model domain.

As is clear from the data flow diagram of FIG. 2 and the above description, the reconciliation operation 230 occurs in the semantic domain. This aspect of the present embodiment provides a number of advantages over reconciliation performed in the complex data model domain. A first advantage is the fact that a reconciling individual may perform the reconciliation in the semantic domain with which s/he is familiar. The reconciler need not be concerned with the low-level details and precise rules of the relevant complex data model because s/he is not required to know them in order to implement the reconciliation. Moreover, the effort required to train a reconciling individual is accordingly lessened because the reconciling individual is only required to have knowledge of the semantic domain, as opposed to both the semantic domain and the complex data model domain. Reconciliation efficiency and accuracy are promoted as a result. A second advantage related to the first is that the need for tedious human parsing of the complex data model is reduced. This is so because manipulation of the received divergent CDMs into a reconciled CDM at the metalanguage level is automated through the use of transforms F1 and F2.

Another important feature of the present embodiment is that the system 10 is configurable to automatically enforce data abstractions and value dependencies existing in the complex data models to be reconciled. With regard to the automatic enforcement of data abstractions, two advantages are provided. First, any supposed discrepancies between corresponding values in received complex data model versions are ensured to represent true discrepancies (requiring reconciliation), and not merely a varied or inconsistent implementation using distinct but semantically equivalent data values (not requiring reconciliation). Second, because "coded" or "implementation-level" values in the received models (which may confuse a reconciler unfamiliar with the relevant data abstraction) may be converted to corresponding semantically meaningful values, comprehensibility of the semantically visualized divergent CDM aspects may be improved. Consistent data representation within the resultant reconciled complex data model may also be achieved. With regard to the automatic enforcement of value dependencies, the primary advantage is a reduced likelihood of reconciliation error, especially in the case when the reconciling individual is unfamiliar with value dependencies existing within the complex data models to be reconciled.

The present embodiment's capacity for configuration for automatic enforcement of data abstractions and value dependencies is best understood through a description of the configuration and operation of the present embodiment to perform a particular reconciliation task, in which the complex data models to be reconciled contain at least one data abstraction and at least one value dependency.

Figure 3:
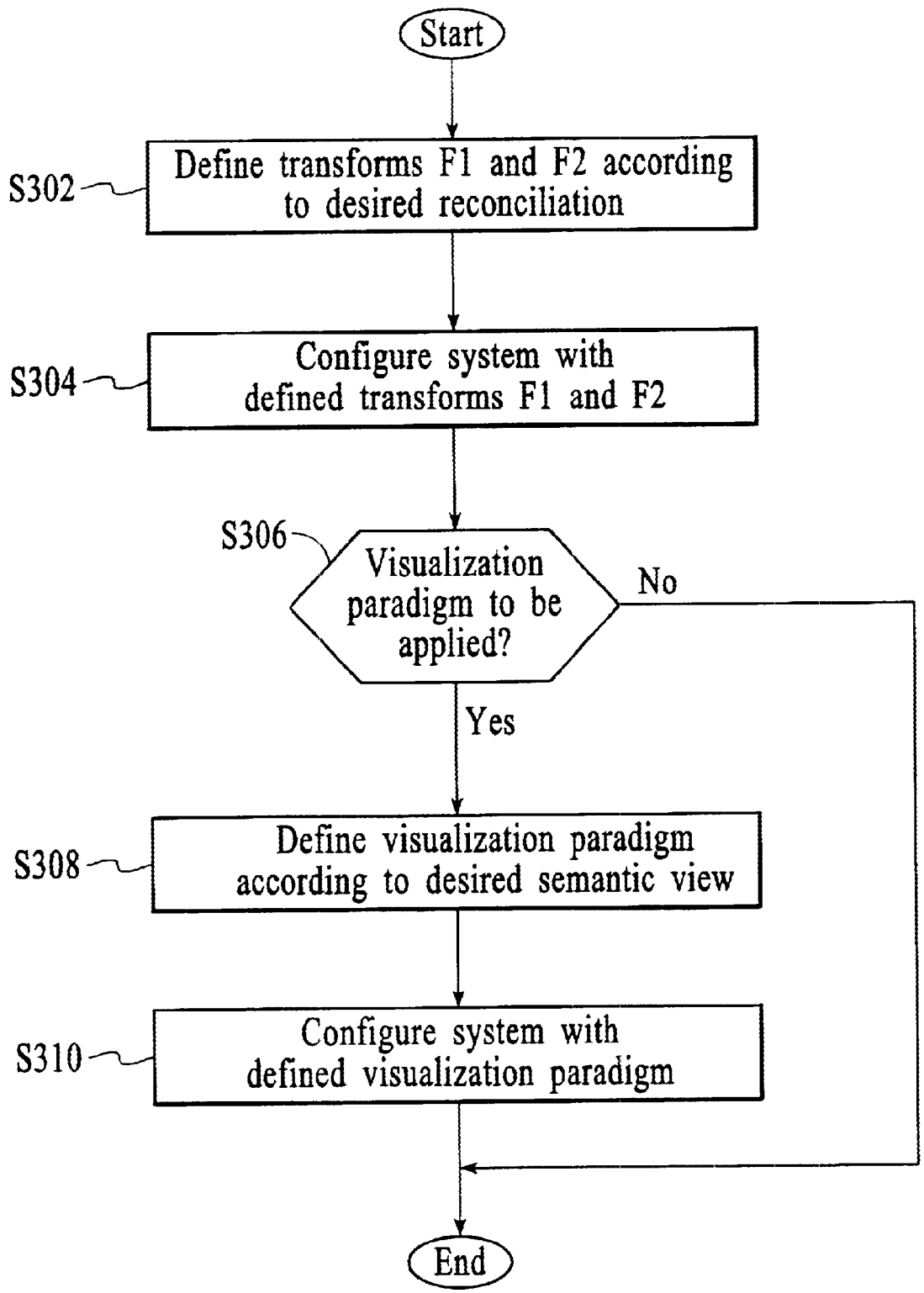
FIG. 3 is a flowchart illustrating a method of system configuration exemplary of an embodiment of the present invention.

FIG. 3 illustrates the configuration of the CDM reconciliation system 10. System configuration is performed by a user prior to the operation of the system 10. The purpose of system configuration is to tailor the system 10 to the CDMs to be reconciled and the desired reconciliation task.

In step S302, the transforms F1 and F2 are defined according to the desired reconciliation. For this step to be performed, the transform designer should be familiar with the CDMs to be reconciled at the complex data model domain level as well as at a semantic level. Moreover, in the event that automatic enforcement of data abstractions and value dependencies is desired (as is the case presently), the designer should have an understanding of the data abstractions and value dependencies existing in the models. The transform designer should be further familiar with the nature, extent and purpose of the desired complex data model reconciliation. For example, it should be determined which aspects, of all the divergent aspects of the complex data models capable of being reconciled, shall actually be reconciled during the subsequent reconciliation. Other desired reconciliation objectives, such as comprehensibility by the reconciling individual, should also be considered. Furthermore, the capabilities and reasonable knowledge of the likely reconciling individual may additionally be relevant.

In the present case, CDMs to be reconciled comprise two versions v.1 and v.2 of an XML data instance representing two versions of a Java language package. Version v.1 of the XML data instance comprises CDM A (illustrated in FIG. 5A) and version v.2 comprises CDM B (FIG. 5B). The illustrated data instances each include four data entities, namely, a package, a file, a class, and a class member. The entities have a containment relationship in that the package entity contains the file entity, which contains the class entity, which in turn contains the member entity. Semantically, the CDMs correspond to a Java class having a single member (representing a copyright notice), which class is contained in a file, which file is part of an overall Java package. Version v.1 of the XML data instance is understood to be older than version v.2.

It is determined in the present case that a data abstraction ("Data Abstraction #1") exists in the complex data models to be reconciled whereby values of either "1" or "private" of the "class" entity's "visible" attribute each connote a private Java class, and similarly values of either "0" or "public" of the "class" entity's "visible" attribute each connote a public Java class. It is further known that a value dependency ("Value Dependency #1") exists in the complex data models to be reconciled whereby the filename of the Java class in the Java package should always be the contained Java class name plus an appended ".java" extension.

With respect to the nature, extent and purpose of the reconciliation, it is established that reconciliation of all aspects of the divergent complex data models is desired. As well, reconciler comprehensibility is determined to be a reconciliation objective.

Taking the above into consideration, transforms F1 and F2 (illustrated in pseudocode form in FIGS. 6A and 6B) are defined. The transforms have the features indicated in Table I below:

TABLE I

Transform F1 and F2 Features

| Feature | Basis | Implementation |
|---|---|---|
| (i) Discrepancies in any of the following entities/attributes as between CDMs A and B shall be reconciled: a) "package" entity - "id" or "name" attribute b) "file" entity - "id" attribute c) "class" entity - "id", "name" or "owner" attribute d) "member" entity - "id", "name", "type" or "initialValue" attribute e) | All aspects of the complex data models are to be reconciled. (The attributes identified at left represent all of the aspects of the present complex data models not otherwise governed by data abstraction or value dependency considerations.) | Transform F1: discrepancies in the identified aspects shall be extracted as fundamental data. Transform F2: fundamental data representing these aspects shall be expanded into the reconciled complex data model. |
| (ii) In the event that the "class" entity's "owner" attribute is to be reconciled, any display of that attribute during reconciliation shall be of the owner's first and last name separated by white space, and not in the form in which it appears in complex data models A and B (e.g. "Joe Smith" not "otherXMLdocument.xml#Joe Smith"). | Comprehensibility. | Transform F1: any extraction of the "class" entity's "owner" attribute shall derive the owner's first and last name from the "attribute" value. Transform F2: expansion of class owner information from the reconciled fundamental data set shall convert the "readable" version of the owner's first and last name back to the original CDM representation. |
| (iii) Discrepancies in the "name" attribute of the "file" entity as between CDMs A and B shall NOT be reconciled; instead, this attribute will always be set to the value of the "name" entity of the "class" entity plus an appended ".java" extension. | Value dependency #1. (Any detected changes in filename as between versions v.1 and v.2 of the Java package description may safely be ignored, because the filename should always be the contained class name plus a ".java" extension. Thus the filename written to the reconciled CDM will be solely dependent on the class name chosen by the reconciler during reconciliation.) | Transform F1: discrepancies in the class filename as between versions v.1 and v.2 of the Java package description are not extracted as fundamental data. Transform F2: in the reconciled complex date model, the "name" attribute of the "file" entity will always be set to the value of the "name" entity of the "class" entity plus an appended ".java" extension. |
| (iv) Discrepancies in the "visible" attribute of the "class" entity as between CDMs A and B shall ONLY be reconciled in the event that the discrepancy comprises a value of "1" or "private" in one received complex data model and a value of "0" or "public" in the other received complex data model. | Data abstraction #1. (The present feature ensures that that any seeming discrepancies between class visibility values as between CDMs A and B actually represent true discrepancies (requiring reconciliation), and not merely implementation inconsistencies between versions (not requiring reconciliation).) | Transform F1: discrepancies in the "visible" attribute of the "class" entity as between CDMs A and B shall ONLY be extracted as fundamental data if the discrepancy comprises a value of "1" or "private" in one received complex data model and a value of "0" or "public" in the other received complex data model. Transform F2: fundamental data representing the "visibility" |

TABLE I-continued

Transform F1 and F2 Features

| Feature | Basis | Implementation |
|---|---|---|
| | | attribute of the "class" entity shall be expanded into the re-conciled complex data model. |
| (v) In the event that the "class" entity's "visible" attribute is to be reconciled, any display of that attribute during reconciliation shall indicate a value of "private", regardless of whether the actual detected attribute value in the original CDMs was "1" or "private". Similarly, any display of the "class" entity's "visible" attribute shall indicate a value of "public" regardless of whether the actual detected attribute value was "0" or "public". | Data abstraction #1 and Comprehensibility. | Transform F1: whenever the "visible" attribute of the "class" entity is extracted as fundamental data, it shall be stored as "private" or "public" not "1" or "0". Transform F2: "visible" attributes of the "class" entity are written to the reconciled complex data model C as "private" or "public" not "1" or "0". |
| (vi) In the event that any data extraction has been triggered from CDMs A and B pursuant to any of the preceding features (i) to (v), ID number information for the Java package, file, class and member shall be available for display during reconciliation. | Comprehensibility. (The availability of package, file, and member entity ID numbers during reconciliation is important to the comprehension of the reconciliation task by the reconciling individual in the present case.) | Transform F1: If any fundamental data extraction has been triggered, extracted fundamental data for each of CDMs A and B shall include ID number attribute values for the package, file, class and member entities, regardless of whether or not this ID information is divergent as between CDMs A and B. |

In the present embodiment, transforms F1 and F2 are chosen to comprise XSL Transforms for three reasons. First, the complex data models to be reconciled are in the XML metalanguage. Second, the fundamental data extractor 20 and the fundamental data expander 50 of the present embodiment are capable of interpreting XSL Transforms. Third, XML Transforms are known to provide an effective means for transforming XML documents from one form or structure to another.

In step S304 of FIG. 3, the CDM reconciliation system 10 is configured with the transforms F1 and F2 in order to tailor the system 10 to the desired reconciliation. In the present embodiment, configuration constitutes a file copy or file overwrite operation of the files comprising transform F1 and transform F2 into a predetermined location in memory of the computing device comprising system 10. The files are named according to a predetermined file naming convention, in order to identify them as the currently operative transforms. Step S304 is initiated by a user, through interaction with a user interface of the CDM reconciliation system 10 (not shown), who identifies transforms F1 and F2 as being the operative transforms (possibly from among multiple sets of transforms F1 and F2 available in the system 10) in a conventional manner.

In step S306, it is determined that a visualization paradigm will in fact be applied in the present embodiment, in order to promote improved semantic comprehensibility. As a result, in step S308, a visualization paradigm is defined to support the desired semantic view. The visualization paradigm may be designed by the designer of first transform F1, who is familiar with the operative reconciliation objectives. The defined visualization paradigm file is illustrated in FIG. 8. According to this paradigm, the semantic view is to be customized in three ways. First, in the event that any divergent aspects of the Java classes of CDMs A and B are to be displayed, a graphical icon "class.gif" shall be displayed. Second, in the event that divergent class owner names are to be displayed, a graphical icon "person.gif" shall be employed. Third, in the event that divergent visibility values are to be displayed, they shall be accompanied by hint text which may assist the reconciling individual 36 in selecting the proper class visibility. Icons "class.gif" and "person.gif" as well as the hint text are chosen on the basis of likely comprehensibility by the reconciling individual 36.

In step S310, the system 10 is configured with the defined visualization paradigm of FIG. 8. In the present embodiment, configuration constitutes a file copy or file overwrite operation of the visualization paradigm file into a predetermined location in memory of the computing device comprising system 10. The file is named according to a predetermined file naming convention, in order to identify it as the operative visualization paradigm of the current reconciliation task. The system 10 is further configured with collateral data as required by the operative visualization paradigm, in this case consisting of the files "class.gif" and "person.gif", in a similar manner. Step S308 is initiated by a user, through interaction with a user interface of the CDM reconciliation system 10 (not shown), who identifies the above-noted visualization paradigm as being the operative paradigm (possibly from among multiple visualization paradigms available in the system 10) in a conventional manner.

Figure 4:
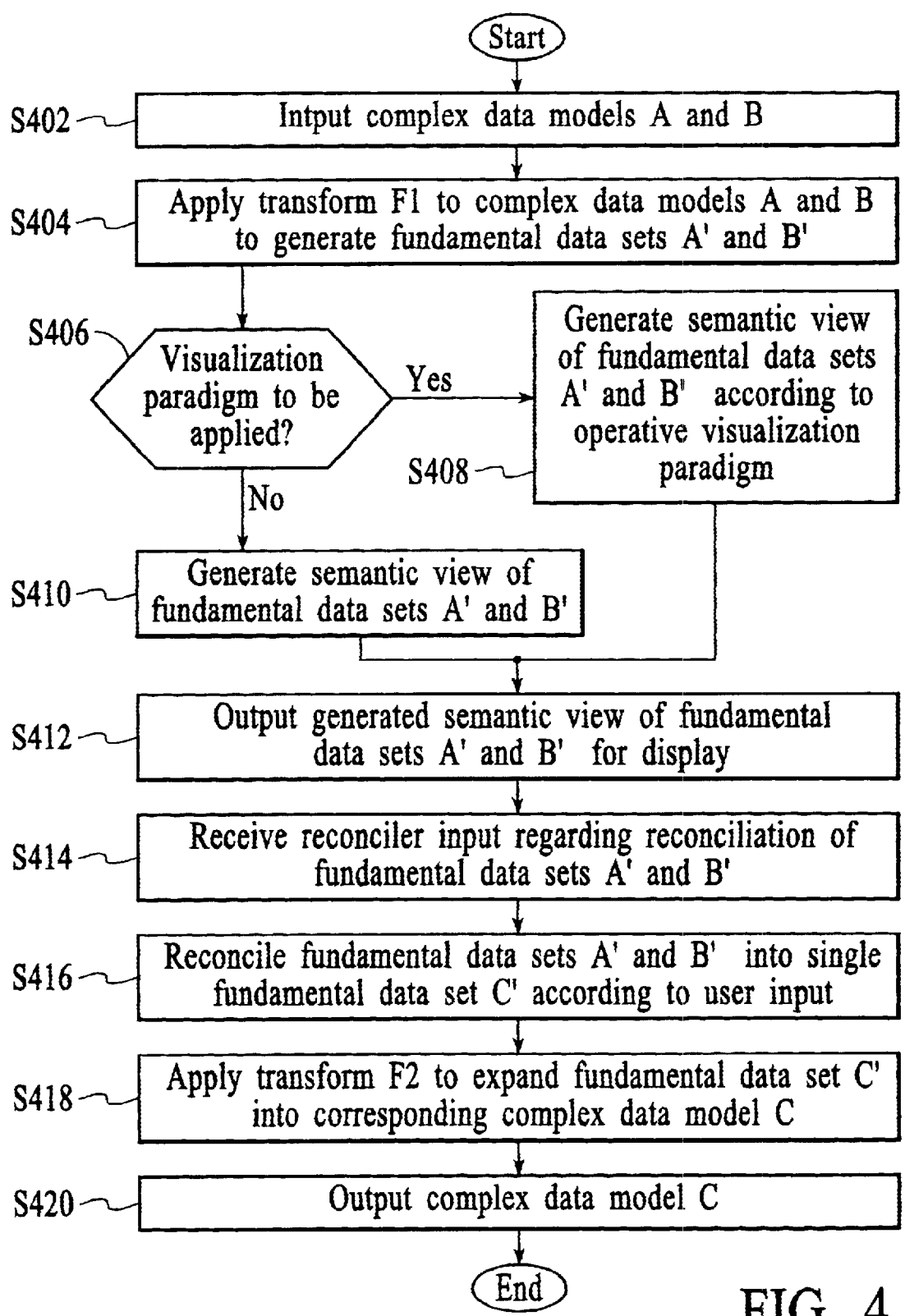
FIG. 4 is a flowchart illustrating a method of system operation exemplary of an embodiment of the present invention.

The operation of the present embodiment is illustrated in FIG. 4, with additional reference to FIGS. 1, 5A, 5B, 6A, 6B, 7A, 7B, 8, 9, 10, 11 and 12. The described operation is a reconciliation of the two versions v.1 and v.2 (CDMs A and B illustrated in FIGS. 5A and 5B, respectively) of an XML data instance.

It will be observed in FIGS. 5A and 5B that complex data models A and B are divergent in four aspects, as indicated in bold type and labeled A through D. In a first divergent aspect A, the value "myClass.java" of the "file" entity's "name" attribute in CDM A differs from the corresponding value "myClass2.java" in CDM B. Semantically, this represents a change in filename from "myClass.java" in version v.1 of the package to "myClass2java" in version v.2 of the package.

In a second divergent aspect B, the value "myClass" of the "class" entity's "name" attribute in CDM A differs from the corresponding value "myClass2" in CDM B. Semantically, this represents a change in class name from "myClass" in version v.1 of the package to "myClass2" in version v.2 of the package.

In a third divergent aspect C, the value "otherXMLdocument.xml#JoeSmith" of the "class" entity's "owner" attribute in CDM A differs from the corresponding value "otherXMLdocument.xml#JohnFish" in CDM B. Semantically, this represents a change in owner of the package from "Joe Smith" to "John Fish".

In a fourth divergent aspect D, the value "1" of the "file" entity's "visible" attribute in CDM A differs from the corresponding value "0" in CDM B. Semantically, this represents a change in class visibility from "private" in version v.1 of the package to "public" in version v.2 of the package. The values "1" and "0" are implementation-level enumerated values corresponding to the visibility values "private" and "public", and are consistent with Data Abstraction #1 existing within complex data models A and B.

The remaining aspects of the complex data models A and B are the same as between versions v.1 and v.2 of the XML data instance. It will be appreciated that these aspects do not require reconciliation by the system 10.

Turning to the system's operation, in an initial step S402 (FIG. 4), complex data models A and B are input into the CDM reconciliation system 10 and received by the fundamental data extractor 20 (FIG. 1). In the present embodiment, the inputting of CDMs A and B is achieved by the reading of two ASCII data files from a computer readable medium, such as a hard drive, floppy disk, or optical storage device. The inputting of the models is initiated by the reconciling individual 36 through interaction with a user interface of the CDM reconciliation system 10 (not shown).

In step S404, the transform F1 is applied to the CDMs A and B to generate fundamental data sets A' and B'. This step is performed in the fundamental data extractor 20, and is initiated by a reconciling individual 36 through interaction with a system user interface (not shown). The fundamental data extractor 20 accesses the first transform F1 by reading the appropriate file from the memory of the system 10. The accessed file represents the transform F1 (FIG. 6A) with which the system was configured during the system configuration stage described above.

In accordance with the instructions provided in transform F1's feature (i), the fundamental data extractor 20 examines received CDMs A and B for discrepancies in any of the attributes listed in the first row of Table I above. This examination reveals two discrepancies as between CDM A and CDM B. The first discrepancy comprises different values "myclass" and "myClass2" of the "class" entity's "name" attribute (i.e. discrepancy B of FIGS. 5A and 5B). The second discrepancy comprises different values "otherXMLdocument.xml#JoeSmith" and "otherXMLdocument.xml#JohnFish" of the "class" entity's "owner" attribute (i.e. discrepancy C of FIGS. 5A and 5B). Accordingly, data extraction from CDMs A and B into corresponding fundamental data sets A' and B' is triggered with respect to both of these divergent attributes. Furthermore, in accordance with transform F1's feature (ii), the "owner" attribute of CDMs A and B is analyzed during extraction to draw out the value for corresponding "author" entities generated in the fundamental data sets. The result is the creation of "author" entities in fundamental data sets A' and B' with values of "Joe Smith" and "John Fish" (illustrated in FIGS. 7A and 7B), as derived from the corresponding "name" attributes of "otherXMLdocument.xml#JoeSmith" in CDM A and "otherXMLdocument.xml#JohnFish" in CDM B.

In accordance with the instructions provided in transform F1's feature (iii), the discrepancy with respect to the "file" entity's "name" attribute (i.e. discrepancy A of FIGS. 5A and 5B) is ignored during fundamental data extraction. As indicated in the description of Table I, this result is intentional because, pursuant to the Value Dependency #1 existing in the received complex data models, changes in filename as between the version v.1 and version v.2 of the XML data instance are insignificant because the filename is solely dependent on the class name.

In accordance with the instructions provided in transform F1's feature (iv), the fundamental data extractor 20 next examines the "class" entity's "visible" attribute for a value of "1" or "private" in one model together with a value of "0" or "public" in the other model. This examination reveals different visibility values of "1" in CDM A versus "0" in CDM B (i.e. discrepancy D of FIGS. 5A and 5B) representative of a true discrepancy requiring reconciliation. Accordingly, data extraction from CDMs A and B into corresponding fundamental data sets A' and B' is triggered with respect to the "visible" attribute. Moreover, in accordance with the transform F1's feature (v), the extraction of visibility values of "1" and "0" from the received CDMs A and B results in the creation of corresponding visibility values of "private" and "public" in fundamental data sets A' and B', respectively, in keeping with Data Abstraction #1 of the received CDMs.

In accordance with the instructions provided in transform F1's feature (vi), the fundamental data extractor module 20 next verifies whether any data extraction from CDMs A and B has been triggered pursuant to any of the above-noted transform F1 features (i) to (v). This verification reveals that data extraction has in fact been triggered pursuant to features (i), (ii), (iv) and (v), as previously discussed. Accordingly, further data extraction is triggered with respect to the "id" attribute of each of the "package", "class", "file" and "member" entities, which are copied to the generated fundamental data sets A' and B' for utilization during reconciliation. It will be appreciated that the instant ID information is extracted into fundamental data sets A' and B' despite the fact that it is not divergent as between CDMs A and B. The incorporation of this information into fundamental data sets A' and B' is performed to facilitate reconciliation in the semantic domain.

Thus, at the conclusion of step S404, the fundamental data sets A' and B', as illustrated in FIGS. 7A and 7B, have been generated by the fundamental data extractor module 20. As can be seen, the generated fundamental data sets A' and B' include aspects of the received models that are to be differenced and merged during the immediate reconciliation, as well as non-divergent aspects usable to facilitate reconciliation by a reconciling individual 36. The generated fundamental data sets A' and B' are output over link 16 to the semantic view pre-processor module 30.

It will be observed that the generated fundamental data sets A' and B' have a class-dominant structure which is imposed during data extraction according to transform F1, whereby extracted package, file, member, visibility and author information are represented as equally subordinate children of the corresponding extracted class entity. This structure differs from the structural hierarchy of the received complex data models consisting of package entities, file entities, class entities and member entities in descending hierarchical order. The class-dominant structure of fundamental data sets A' and B' reflects the fact that reconciliation in the present example is primarily class-based. As well, the class-dominant structure is designed to support the class-dominant semantic visualization scheme to be employed during semantic view generation.

In step S406, the semantic view pre-processor 30 verifies whether or not a visualization paradigm will be applied in the present reconciliation. In the present embodiment, the semantic view pre-processor 30 executes step S406 by examining the memory of system 10 for the existence of a visualization paradigm file known to represent the current visualization paradigm. This examination reveals that a current visualization paradigm file (illustrated in FIG. 8) with which the system 10 was configured during the system configuration stage does exist. Accordingly, the semantic view pre-processor 30 confirms that application of a visualization paradigm is to occur during semantic view generation and reads the visualization paradigm file from memory.

In step S408, the semantic view pre-processor 30 generates rendering instructions to create a semantic view of the fundamental data sets A' and B' in accordance with the operative visualization paradigm. The semantic view pre-processor 30 compares the two fundamental data sets A' and B' to identify discrepancies that are to be reconciled during the immediate reconciliation. In the present case, three discrepancies (indicated in bold type and labeled I to III in FIGS. 7A and 7B) are identified. In a first discrepancy I, the value "myclass" of the "class" entity's "name" attribute in fundamental data set A' differs from the corresponding value "myClass2" in fundamental data set B'. In a second discrepancy II, the value "private" of the "visibility" entity in fundamental data set A' differs from the corresponding value "public" in fundamental data set B'. In a third discrepancy III, the value "Joe Smith" of the "author" entity in fundamental data set A' differs from the corresponding value "John Fish" in fundamental data set B'.

Subsequently, for each identified discrepancy I to III as between fundamental data sets A' and B', the semantic view pre-processor 30 generates rendering instructions usable by a rendering system 44 to display the discrepancy in a manner suitable for allowing a reconciling individual 36 to determine the difference between the divergent aspects and to reconcile them. In performing this step, the semantic view pre-processor 30 applies the operative visualization paradigm, which is determinative of whether a particular semantic view is dictated for a particular discrepancy, in order to determine the type of rendering instructions that must be generated.

Accordingly, the semantic view pre-processor 30 generates rendering instructions for the display of graphics components 900, 940 and 950 (illustrated in FIG. 9) to represent discrepancies I, II and III respectively. Graphics component 900 includes an icon portion 902 and a radio button portion 904. The icon 902 is a custom icon "class.gif" which is included pursuant to the first "Class" member of the operative visualization paradigm (FIG. 8). The radio button portion 904 displays the divergent class names in a manner which will allow the discrepancy to be identified (by visual observation of the different names) and reconciled (by a reconciler's selection of one or the other radio button).

Graphics component 950 has an analogous appearance to graphics component 900, except that its icon portion 952 is a different custom icon "person.gif" as dictated by the third "author" member of the operative visualization paradigm. The graphics component 950 includes a radio button portion 954 analogous to the radio button portion 904 of graphics component 900.

Graphics component 940 is similar in appearance to graphics components 900 and 950 except that its icon portion 942 is not a custom icon. Instead, icon portion 942 of graphics component 940 is a generic icon that is employed in the absence of any overriding customization requirements of the operative visualization paradigm. The graphics component 940 includes a radio button portion 944 that is analogous to the radio button portions 904 and 954 of graphics components 900 and 950. The graphics component 940 has an additional feature (not illustrated) dictated by the second "visibility" member of the operative visualization paradigm whereby hint text will appear as "hover text" when the graphics component 940 is highlighted by a user (e.g. by the movement of a mouse pointer within the displayed boundaries of graphics component 940).

For each non-divergent aspect in the fundamental data sets A' and B', the semantic view pre-processor 30 generates instructions to display the non-divergent information in a manner which will facilitate the reconciliation of the divergent aspects by the reconciling individual 36. Accordingly, the semantic view pre-processor 30 generates instructions for the creation of graphics components 910, 920 and 930, to represent the "package", "file", and "copyrightmember" entities common to fundamental data sets A' and B'. The non-divergent status of these displayed aspects is apparent due to the absence of any user interface controls (e.g. radio buttons) in the graphics components 910, 920 and 930. The graphics components 900, 910, 920 and 930 include ID information from fundamental data sets A' and B' which is also available to the reconciler in the form of hover text (not illustrated) upon the highlighting of these components.

The semantic view pre-processor 30 additionally generates rendering instructions for the display of relationship indicator lines 916, 926, 936, 946 and 956 between the various displayed components. These indicator lines provide additional information to the reconciler as to the inter-relationship between the displayed graphics components, which may assist the reconciler's understanding of the reconciliation task at hand.

If no visualization paradigm were operative in the present embodiment, the semantic view pre-processor 30 would have determined this fact in step S406 and proceeded in step S410 to generate rendering instructions for the creation of a semantic view of fundamental data sets A' and B' in the absence of a visualization paradigm. The generated instructions would result in a semantic view similar to the one illustrated in FIG. 9, with the exception that custom icons 902 and 952 would instead have been generic icons similar to those used in graphics components 910, 920, 930 and 940, and with the further exception that no explanatory hover text would have been provided with respect to graphics component 940.

In step S412, the rendering instructions generated by the semantic view pre-processor 30 are output to the rendering system 44 for display to a reconciling individual 36. The resultant semantic view displayed by rendering system 44 is illustrated in FIG. 9.

The reconciling individual 36 subsequently employs user input mechanism 46 to interact with the semantically displayed fundamental data sets A' and B' in step S414 to effect a reconciliation of the displayed divergent aspects. For each discrepancy (indicated by the presence of radio buttons), the user selects one or the other displayed aspect version as being the "correct" version. The reconciler's interaction may also include examination of displayed non-divergent aspects for the purpose of gaining a better understanding of the reconciliation task.

Figure 9:
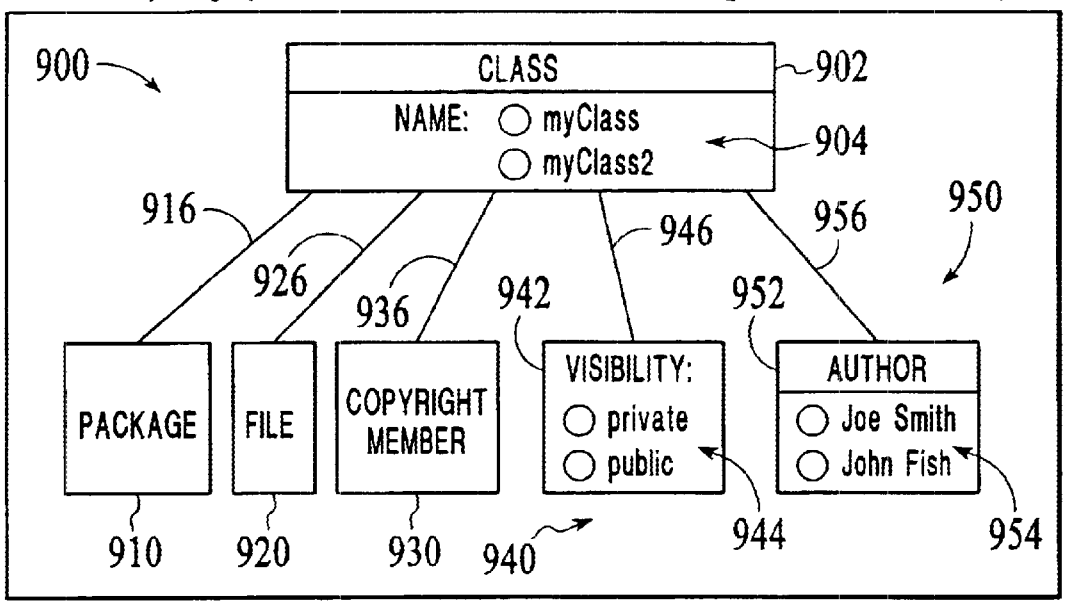
FIG. 9 illustrates an exemplary semantic view of fundamental data sets A' and B' of FIGS. 7A and 7B prior to reconciliation by a reconciling individual.
Figure 10:
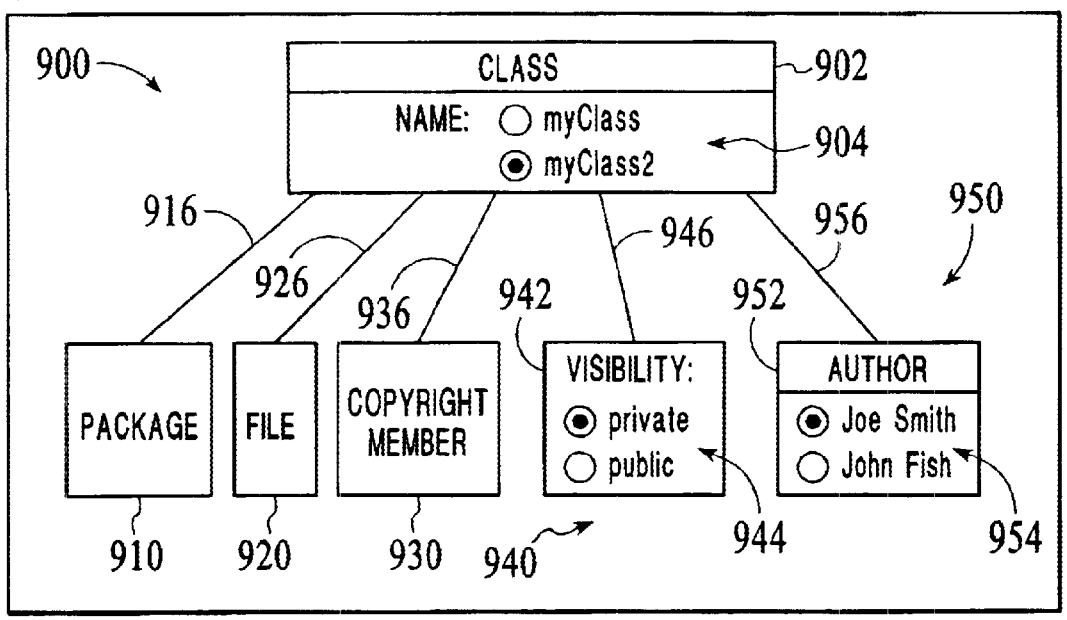
FIG. 10 illustrates the semantic view of FIG. 9 after reconciliation has been performed by a reconciling individual.

FIG. 10 illustrates the displayed semantic view of FIG. 9 at the conclusion of reconciliation by the reconciling individual 36. The user's selections are indicated by the presence of a dot within one or the other radio button of each displayed radio button pair. The displayed dots indicate that the reconciler has chosen the class name to be "myClass2", the visibility to be "private", and the author name to be "Joe Smith". This displayed view is semantically representative of an as-yet nonexistent single fundamental data set C' in which the divergent aspects of fundamental data sets A' and B' have been reconciled. The reconciling individual 36 indicates completion of the reconciliation task through interaction with a user interface of the CDM reconciliation system 10 (not shown), by clicking on a "done" button in a displayed menu bar for example, which causes reconciliation instructions indicative of the reconciler's selections to be sent from the user input mechanism 46 to the reconciliation engine 40.

In step S416, the reconciliation engine reconciles the fundamental data sets A' and B' into a single reconciled fundamental data set C' (illustrated in FIG. 11). The reconciliation engine 40 interprets the reconciliation instructions received from the user input mechanism 46 and creates a fundamental data set C' by selecting, for each discrepancy I to III in fundamental data sets A' and B', a "correct" version of the divergent aspect based on the interpreted reconciler instructions. The reconciliation engine 40 may reference the fundamental data sets A' and B' received over link 18 as necessary during this process for the purpose of obtaining metalanguage fragments for copying into fundamental data set C'. At the conclusion of this step, the received fundamental data set C' of FIG. 11 is output to the fundamental data expander 50 over link 42.

In a subsequent step S418, the fundamental data expander 50 applies transform F2 to expand the received fundamental data set C' into a corresponding full complex data model C. The fundamental data expander 50 accesses the second transform F2 by reading the appropriate file from the memory of the system 10. The accessed file represents the transform F2 (FIG. 6B) with which the system was configured during the system configuration stage.

In accordance with the instructions provided in transform F2's feature (i), the fundamental data expander 50 examines received fundamental data set C' for any reconciled divergent aspects corresponding to the attributes listed in the first row of Table I above. This examination reveals two reconciled aspects (indicated in bold in FIG. 11) comprising the value "myClass2" of the "class" entity's "name" attribute and the value "Joe Smith" of the "author" entity. Accordingly, the fundamental data expander 50 expands these reconciled aspects into corresponding metalanguage within new complex data model C. During this expansion, the fundamental data expander 50 references received CDMs A and B to ensure that the metalanguage generated in CDM C is consistent with the metalanguage of CDMs A and B. Furthermore, in accordance with transform F2's feature (ii), the "author" entity of fundamental data set C' is processed to convert the "readable" version of the owner's first and last name back to the original CDM representation. The result is the generation of the value "otherXMLdocument.xml#JoeSmith" in the "owner" attribute of the "class" entity in CDM C, based on the value "Joe Smith" from fundamental data set C'.

In accordance with the instructions provided in transform F2's feature (iv), the fundamental data expander 50 examines received fundamental data set C' for the any reconciled divergent aspects corresponding to the "visible" attribute of the "class" entity. This examination reveals a reconciled aspect II comprising the value "private" of the "visibility" entity. Accordingly, the fundamental data expander 50 expands this reconciled aspect into corresponding metalanguage within new complex data model C. During this expansion, the fundamental data expander 50 references received CDMs A and B to ensure that the metalanguage generated in CDM C is consistent with the metalanguage of CDMs A and B. Moreover, in accordance with transform F2's feature (v), when the "visibility" entity of the fundamental data set C' is expanded to a corresponding aspect in new CDM C, the value assigned to the "visible" attribute of the new "class" entity is "private" not "1". This action is taken pursuant to Data Abstraction #1 of the complex data model as well as for comprehensibility and consistency reasons, so that any references to private classes within the new CDM C will consistently use the more comprehensible value "private" rather than the less comprehensible value "1".

In accordance with the instructions provided in transform F2's feature (iii), the fundamental data expander 50, which has previously determined that received fundamental data set C' contains a reconciled divergent class name, sets the value of the "file" entity's "name" attribute in CDM C to the value "myClass2" of the "class" entity's "name" attribute plus a "Java" extension. This action is taken pursuant to Value Dependency #1 of the complex data model, which provides that file names shall mirror their contained class names.

The remaining aspects of the complex data model C, which correspond to the aspects of complex data models A and B which were consistent as between versions v.1 and v.2, are generated in CDM C by fundamental data expander 50 through the reproduction of the associated metalanguage from either of CDM A or CDM B. Thus, at the conclusion of step S418, the reconciled complex data model C (illustrated in FIG. 12), representative of a reconciliation of the originally received CDMs A and B in the aspects identified during system configuration, has been generated by the fundamental data expander 50. The reconciled complex data model C is output from the fundamental data expander 50 and the CDM reconciliation system 10 in step S420.

It will be appreciated that the reconciliation of complex data models A and B as described above has resulted in the automatic enforcement of Data Abstraction #1 and Value Dependency #1 within reconciled model C. This automatic enforcement has occurred as a direct consequence of the design of transforms F1 and F2, with which the CDM reconciliation system 10 was configured during the configuration stage, to support that objective. A system 10 that has been configured with transforms F1 and F2 of the present embodiment will automatically enforce Data Abstraction #1 and Value Dependency #1 each time reconciliation is performed, even if the reconciling individual 36 is unaware of the existence of this data abstraction and value dependency. Thus, one-time design of transforms F1 and F2 by a designer knowledgeable about the complex data model domain is sufficient to allow the system 10 to later be used, possibly multiple times, by a reconciling individual 36 who may have little or no knowledge of the complex data model domain.

It is of course possible that a reconciling individual 36, upon visual examination of the semantic view displayed on the rendering system 44 after the execution of step S412 (FIG. 4), may identify one or the other fundamental data set A' or B' as representing a "correct" version of the complex data model (e.g. if it is known to be more recent) with the other set B' or A' being entirely "incorrect". In this case, the reconciliation is completed at that stage because the complex data model A or B corresponding to the "correct" fundamental data set A' or B' is already in a "correct" state. The reconciling individual 36 may abort the remainder of the aforedescribed reconciliation process and simply utilize the original CDM A or B as the "reconciled" or "correct" model C. Such circumvention of steps S414 to S420 may be achieved by the reconciler through interaction with the user interface of the CDM reconciliation system 10 (not shown) which causes the reconciliation process to terminate accordingly.

As will be appreciated by those skilled in the art, modifications to the above-described embodiment can be made without departing from the essence of the invention. For example, it is possible to implement a CDM reconciliation system 10 in which the transforms F1 and F2 are embedded within the complex data models A and B to be reconciled. In this case, the fundamental data extractor 20 obtains the transform F1 necessary for data extraction from within the received CDMs A and B, and the secondary input 24 is therefore unnecessary. Moreover, the fundamental data expander 50 may obtain the transform F2 necessary for fundamental data expansion from within the CDMs A and B received over link 14, so that the secondary input 26 is also unnecessary.

Other modifications will be apparent to those skilled in the art and, therefore, the invention is defined in the claims.

What is claimed is:

1. A method of semantically reconciling complex data models, said method comprising the steps of:
   (a) receiving a first complex data model A and a second complex data model B, said complex data models each having meaning in a semantic domain;
   (b) applying a first transform function F1 to each of said data models A and B to extract fundamental data sets A' and B' representing aspects of complex data models A and B to be reconciled; and
   (c) presenting said fundamental data sets A' and B' in said semantic domain in a manner suitable for identifying differences between said aspects and reconciling said aspects.

2. The method of claim 1, further comprising:
   (d) receiving input representative of a reconciliation of said fundamental data sets A' and B',
   (e) reconciling said fundamental data sets A' and B' in accordance with said input to generate a fundamental data set C'; and
   (f) applying a second transform function F2 to said fundamental data set C' to produce a complex data model C representative of a reconciliation of complex data models A and B.

3. The method of claim 2, wherein said transforms F1 and F2 provide for automatic enforcement during reconciliation of a complex data model feature selected from the group of complex data model features consisting of data abstractions and value dependencies.

4. The method of claim 2, wherein said complex data models A, B and C comprise data instance files.

5. The method of claim 2, wherein said complex data models A, B and C comprise metadata schemas.

6. The method of claim 5 wherein said metadata schemas are selected from the group consisting of XML Metadata Interchange (XMI) files and Document Type Definition (DTD) files.

7. The method of claim 2, wherein said transform functions F1 and F2 comprise XSL Transformations.

8. The method of claim 7, further comprising the step of applying a visualization paradigm to customize the semantic presentation of fundamental data sets A and B in said semantic domain.

9. The method of claim 1, wherein said complex data models A and B comprise data instance files.

10. The method of either of claims 9, wherein said data instance files are selected from the group consisting of Extensible Markup Language (XML) data files and Standard Generalized Markup Language (SGML) data files.

11. The method of claim 1, wherein said complex data models A and B comprise metadata schemas.

12. The method of claim 11, wherein said metadata schemas are selected from the group consisting of XML Metadata Interchange (XMI) files and Document Type Definition (DTD) files.

13. The method of claim 1, wherein said transform function F1 comprises an Extensible Stylesheet Language (XSL) Transformation.

14. The method of claim 1, further comprising the step of applying a visualization paradigm to customize the semantic presentation of fundamental data sets A and B in said semantic domain.

15. A computer readable medium containing program instructions storing computer software that, when loaded into a computing device, adapts said device to semantically reconcile complex data models, the program instructing for:
   (a) receiving a first complex data model A and a second complex data model B, said complex data models each having meaning in a semantic domain;
   (b) applying a first transform function F1 to each of said data models A and B to extract fundamental data sets A' and B' representing aspects of complex data models A and B to be reconciled; and
   (c) presenting said fundamental data sets A' and B' in said semantic domain in a manner suitable for identifying differences between said aspects and reconciling said aspects.

16. The computer readable medium of claim 15, further capable of adapting said computing device to semantically reconcile complex data models by:
   (d) receiving input representative of a reconciliation of said fundamental data sets A' and B';
   (e) reconciling said fundamental data sets A' and B' in accordance with said input to generate a fundamental data set C'; and
   (f) applying a second transform function F2 to said fundamental data set C' to produce a complex data model C representative of a reconciliation of complex data models A and B.

17. The computer readable medium of claim 16, wherein said transforms F1 and F2 provide for automatic enforcement during reconciliation of a complex data model feature selected from the group of complex data model features consisting of data abstractions and value dependencies.

18. The computer readable medium of claim 16, wherein said complex data models A, B and C comprise data instance files.

19. The computer readable medium of claim 18, wherein said data instance files are selected from the group consisting of XML data files and SGML data files.

20. The computer readable medium of claim 16, wherein said complex data models A, B and C comprise metadata schemas.

21. The computer readable medium of claim 20, wherein said metadata schemas are selected from the group consisting of XMI files and DTD files.

22. The computer readable medium of claim 16, wherein said transform functions F1 and F2 comprise XSL Transformations.

23. The computer readable medium of claim 22, further capable of adapting said computing device to apply a visualization paradigm to customize the semantic presentation of fundamental data sets A and B in said semantic domain.

24. The computer readable medium of claim 15, further capable of adapting said computing device to apply a visualization paradigm to customize the semantic presentation of fundamental data sets A and B in said semantic domain.

25. The computer readable medium of claim 15, wherein said transform function F1 comprises an XSL Transformation.

26. The computer readable medium of claim 15, wherein said complex data models A and B comprise data instance files.

27. The computer readable medium of claim 26, wherein said data instance files are selected from the group consisting of XML data files and SGML data files.

28. The computer readable medium of claim 15, wherein said complex data models A and B comprise metadata schemas.

29. The computer readable medium of claim 28, wherein said metadata schemas are selected from the group consisting of XMI files and DTD files.

30. A computing device operable to semantically reconcile complex data models by:
(a) receiving a first complex data model A and a second complex data model B, said complex data models each having meaning in a semantic domain;
(b) applying a first transform function F1 to each of said data models A and B to extract fundamental data sets A' and B' representing aspects of complex data models A and B to be reconciled; and
(c) presenting said fundamental data sets A' and B' in said semantic domain in a manner suitable for identifying differences between said aspects and reconciling said aspects.

31. The computing device of claim 30, further operable to semantically reconcile complex data models by:
(d) receiving input representative of a reconciliation of said fundamental data sets A' and B';
(e) reconciling said fundamental data sets A' and B' in accordance with said input to generate a fundamental data set C'; and
(f) applying a second transform function F2 to said fundamental data set C' to produce a complex data model C representative of a reconciliation of complex data models A and B.

32. The computing device of claim 31, wherein said transforms F1 and F2 provide for automatic enforcement during reconciliation of a complex data model feature selected from the group of complex data model features consisting of data abstractions and value dependencies.

33. The computing device of claim 31, wherein said complex data models A, B and C comprise metadata schemas.

34. The computing device of claim 33, wherein said metadata schemas are selected from the group consisting of XMI files and DTD files.

35. The computing device of claim 31, wherein said complex data models A, B and C comprise data instance files.

36. The computing device of claim 35, wherein said data instance files are selected from the group consisting of SML data files and SGML data files.

37. The computing device of claim 31, wherein said transform functions F1 and F2 comprise XSL Transformations.

38. The computing device of claim 37, further operable to apply a visualization paradigm to customize the semantic presentation of fundamental data sets A and B in said semantic domain.

39. The computing device of claim 30, wherein said complex data models A and B comprise metadata schemas.

40. The computing device of claim 39, wherein said metadata schemas are selected from the group consisting of XMI files and DTD files.

41. The computing device of claim 30, wherein said transform function F1 comprises an XSL Transformation.

42. The computing device of claim 30, further operable to apply a visualization paradigm to customize the semantic presentation of fundamental data sets A and B in said semantic domain.

43. The computing device of claim 30, wherein said complex data models A and B comprise data instance files.

44. The computing device of claim 43, wherein said data instance files are selected from the group consisting of XML data files and SGML data files.

45. A system for semantically reconciling complex data models, said system comprising:
means for receiving a first complex data model A and a second complex data model B, said complex data models each having meaning in a semantic domain;
means for applying a first transform function F1 to each of said data models A and B to extract fundamental data sets A' and B' representing aspects of complex data models A and B to be reconciled; and
means for presenting said fundamental data sets A' and B' in said semantic domain in a manner suitable for identifying differences between said aspects and reconciling said aspects.

46. The system of claim 45, further comprising:
means for receiving input representative of a reconciliation of said fundamental data sets A' and B';
means for reconciling said fundamental data sets A' and B' in accordance with said input to generate a fundamental data set C'; and
means for applying a second transform function F2 to said fundamental data set C' to produce a complex data model C representative of a reconciliation of complex data models A and B.

47. A method for facilitating reconciliation of complex data models (CDMs), comprising the steps of:
(a) comparing corresponding elements of a first CDM and a second CDM to identify differences;
(b) for each difference between a given element in said first CDM and a corresponding element in said second CDM, determining whether said each difference is fundamental based on a set of value dependencies and data abstractions; and
(c) for each CDM of said first CDM and said second CDM, forming a fundamental element set, said fundamental element set comprising each element of said each CDM which contributed to one fundamental difference.

48. A method of semantically reconciling complex data models, said method comprising the steps of:
(a) receiving input representative of a reconciliation of a fundamental data set A' extracted from a first complex data model A and a fundamental data set B¢ extracted from a second complex data model B;
(b) reconciling said fundamental data sets A' and B' in accordance with said input to generate a fundamental data set C'; and
(c) applying a transform function F2 to said fundamental data set C' to produce a complex data model C representative of a reconciliation of complex data models A and B.

* * * * *